United States Patent
Bae et al.

(10) Patent No.: US 12,405,310 B2
(45) Date of Patent: Sep. 2, 2025

(54) BATTERY MANAGEMENT APPARATUS AND METHOD

(71) Applicant: LG Energy Solution, Ltd., Seoul (KR)

(72) Inventors: Yoon-Jung Bae, Daejeon (KR); A-Ming Cha, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 404 days.

(21) Appl. No.: 17/923,027

(22) PCT Filed: Nov. 17, 2021

(86) PCT No.: PCT/KR2021/016934
§ 371 (c)(1),
(2) Date: Nov. 3, 2022

(87) PCT Pub. No.: WO2022/108344
PCT Pub. Date: May 27, 2022

(65) Prior Publication Data
US 2023/0176128 A1 Jun. 8, 2023

(30) Foreign Application Priority Data
Nov. 17, 2020 (KR) .................. 10-2020-0153903

(51) Int. Cl.
*G01R 31/36* (2020.01)
*G01R 31/382* (2019.01)
(Continued)

(52) U.S. Cl.
CPC ....... *G01R 31/3648* (2013.01); *G01R 31/382* (2019.01); *G01R 31/396* (2019.01); *H01M 10/46* (2013.01); *H01M 2010/4271* (2013.01)

(58) Field of Classification Search
CPC ............. G01R 31/3648; G01R 31/382; G01R 31/396; H01M 2010/4271
See application file for complete search history.

(56) References Cited

U.S. PATENT DOCUMENTS

2016/0190827 A1   6/2016   Ezawa et al.
2016/0233691 A1   8/2016   Sumi et al.
(Continued)

FOREIGN PATENT DOCUMENTS

EP    3876334 A1    9/2021
JP    201389423 A   5/2013
(Continued)

OTHER PUBLICATIONS

International Search Report for Application No. PCT/KR2021/016934 mailed Feb. 18, 2022, pp. 1-3.
EESR for Application No. 21895112.7 dated Mar. 7, 2024. 6 pgs.

*Primary Examiner* — Ricky Go
(74) *Attorney, Agent, or Firm* — Lerner David LLP

(57) ABSTRACT

A battery management apparatus and method capable of preventing lithium plating from occurring in a battery cell by determining an optimal upper limit C-rate corresponding to the battery cell. In particular, since the charging and discharging of the battery cell may be controlled according to the determined upper limit C-rate, it is possible to prevent side reactions from occurring in the battery cell due to charging and discharging according to the high C-rate, and since the degradation of the battery cell may be slowed, the lifespan of the battery cell may be increased.

10 Claims, 4 Drawing Sheets

(51) Int. Cl.
  *G01R 31/396* (2019.01)
  *H01M 10/46* (2006.01)
  *H01M 10/42* (2006.01)

(56) References Cited

U.S. PATENT DOCUMENTS

| | | |
|---|---|---|
| 2017/0234930 A1 | 8/2017 | Lee et al. |
| 2017/0279171 A1 | 9/2017 | Ishibashi |
| 2018/0145531 A1 | 5/2018 | Jung et al. |
| 2018/0203071 A1 | 7/2018 | Takemura et al. |
| 2019/0168617 A1 | 6/2019 | Ling et al. |
| 2019/0202299 A1 | 7/2019 | Oh et al. |
| 2020/0150183 A1* | 5/2020 | Yoon .................. G01R 31/367 |
| 2020/0212684 A1* | 7/2020 | Campbell ........... H01M 10/425 |
| 2020/0271727 A1 | 8/2020 | Bae et al. |
| 2021/0104782 A1 | 4/2021 | Park et al. |
| 2022/0276314 A1 | 9/2022 | Kim et al. |

FOREIGN PATENT DOCUMENTS

| | | |
|---|---|---|
| JP | 2013240153 A | 11/2013 |
| JP | 201561445 A | 3/2015 |
| JP | 2016-149211 A | 8/2016 |
| JP | 6535890 B2 | 7/2019 |
| JP | 2019165553 A | 9/2019 |
| KR | 20180056238 A | 5/2018 |
| KR | 101897859 B1 | 9/2018 |
| KR | 20190048849 A | 5/2019 |
| KR | 20190054513 A | 5/2019 |
| KR | 20190081237 A | 7/2019 |
| KR | 20190118535 A | 10/2019 |
| KR | 20200062672 A | 6/2020 |
| KR | 20200117794 A | 10/2020 |
| WO | 2017-010475 A1 | 1/2017 |
| WO | 2021-049882 A1 | 3/2021 |

\* cited by examiner

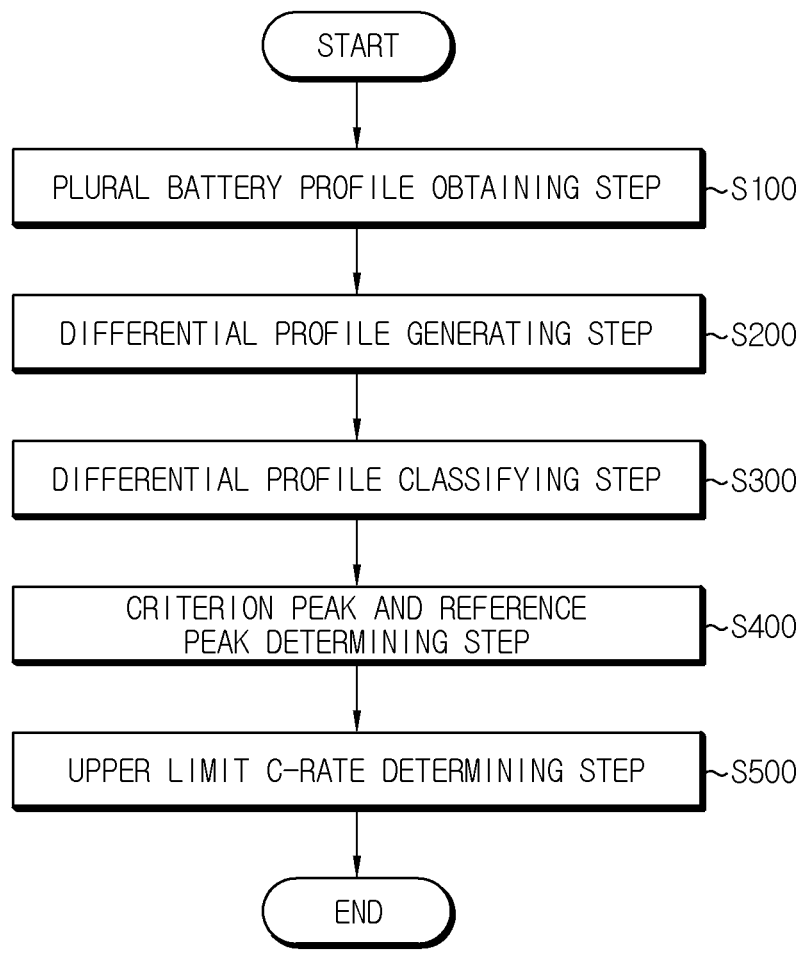

BATTERY MANAGEMENT APPARATUS AND METHOD

CROSS REFERENCE TO RELATED APPLICATIONS

The present application is a national phase entry of 35 U.S.C. § 371 of International Application No. PCT/KR2021/016934 filed Nov. 17, 2021, which claims priority from Korean Patent Application No. 10-2020-0153903 filed on Nov. 17, 2020 in the Republic of Korea, the disclosures of which are incorporated herein by reference.

TECHNICAL FIELD

The present disclosure relates to a battery management apparatus and method, and more particularly, to a battery management apparatus and method capable of setting an upper limit current rate (C-rate) of a battery cell.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

In general, in the process of repeated charging and discharging, a battery may be gradually degraded as side reactions are generated. For example, when charging and/or discharging is performed at a high C-rate, lithium plating in which lithium is deposited on a negative electrode of the battery may occur. When lithium plating occurs in the battery, the negative electrode capacity of the battery is lost, so there is a problem that the life of the battery may be reduced.

Conventionally, by analyzing the profile for the battery, it is diagnosed whether and when lithium plating occurs. However, in the case of a degraded cell whose internal resistance is increased due to degradation, it is difficult to accurately diagnose the occurrence time. In addition, in the prior art, since it is diagnosed whether and when lithium plating occurs after lithium plating occurs, there is a limit in preventing lithium plating from occurring in the battery.

SUMMARY

Technical Problem

The present disclosure is designed to solve the problems of the related art, and therefore the present disclosure is directed to providing a battery management apparatus and method capable of preventing lithium plating from occurring in a battery cell by determining an optimal upper limit C-rate corresponding to the battery cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to one aspect of the present disclosure, which manages a battery cell charged multiple times at each of a plurality of current rates (C-rates), may comprise: a controller; and memory having stored thereon instructions that, when executed, are configured to cause the controller to for each of a plurality of battery profiles representing a relationship between voltage and capacity of a battery cell at respective current rates (C-rates), obtain a differential profile representing a relationship between the voltage and a differential capacity of the battery cell, classify the plurality of differential profiles into a threshold differential profile corresponding to a preset threshold C-rate and a plurality of reference differential profiles, determine a threshold peak in the threshold differential profile, determine a plurality of reference peaks including a respective reference peak in each of the plurality of reference differential profiles, compare a voltage of the determined criterion peak with a voltage of the plurality of determined reference peaks, and determine an upper limit C-rate for the battery cell based on the comparison.

The instructions may be configured to cause the controller to for each respective reference peak of the plurality of reference peaks, calculate a respective voltage difference between the threshold peak and the reference peak, compare the respective calculated voltage differences with a preset threshold voltage, and determine the upper limit C-rate based on the comparison.

The instructions may be configured to cause the controller to determine a reference peak for which the corresponding calculated voltage difference is equal to or greater than the threshold voltage as a target peak, and determine a C-rate corresponding the reference differential profile including the determined target peak as the upper limit C-rate.

The instructions may be configured to cause the controller to generate a voltage profile representing a relationship between the respective voltage differences and the plurality of C-rates, and determine an upper limit C-rate as the threshold voltage in the generated voltage profile.

The instructions may be configured to cause the controller to obtain the plurality of battery profiles, determine, from among the plurality of obtained battery profiles, a threshold battery profile corresponding to the threshold C-rate and a reference battery profile corresponding to a reference C-rate, and set the threshold voltage based on the determined threshold battery profile and the determined reference battery profile.

The instructions may be configured to cause the controller to select a reference capacity satisfying a predetermined condition in the reference battery profile, and set a voltage corresponding to the reference capacity in the threshold battery profile as the threshold voltage.

The instructions may be configured to cause the controller to select a capacity corresponding to a point in the reference battery profile at which a negative electrode voltage is 0 as the reference capacity.

The instructions may be configured to cause the controller to set a negative electrode voltage corresponding to the reference capacity in the threshold battery profile as the threshold voltage.

A battery pack according to another aspect of the present disclosure may comprise the battery management apparatus according to one aspect of any of the embodiments described in the present disclosure.

A battery management method according to still another aspect of the present disclosure, which manages a battery cell charged multiple times at each of a plurality of C-rates, may comprise: obtaining a plurality of battery profiles representing a corresponding relationship between voltage and capacity of the battery cell at each of the plurality of C-rates; for each of a plurality of battery profiles representing a relationship between voltage and capacity of a battery cell at respective C-rate, obtaining, by a controller, a differential profile representing a relationship between the voltage and a differential capacity of the battery cell; classifying, by the controller, the plurality of differential profiles into a threshold differential profile corresponding to a preset threshold C-rate and a plurality of reference differential profiles; determining, by the controller, a threshold peak in the threshold differential profile; determining, by the controller, a plurality of reference peaks including a respective reference peak in each of the plurality of reference differential profiles; comparing, by the controller, a voltage of the determined threshold peak with a voltage of the plurality of determined reference peaks; and determining, by the controller, an upper limit C-rate for the battery cell based on the comparison.

Advantageous Effects

According to one aspect of the present disclosure, since the charging and discharging of the battery cell may be controlled according to the determined upper limit C-rate, it is possible to prevent side reactions from occurring in the battery cell due to charging and discharging according to the high C-rate, and since the degradation of the battery cell may be slowed, the lifespan of the battery cell may be increased.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 6 is a diagram schematically showing a battery management method according to still another embodiment of the present disclosure.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
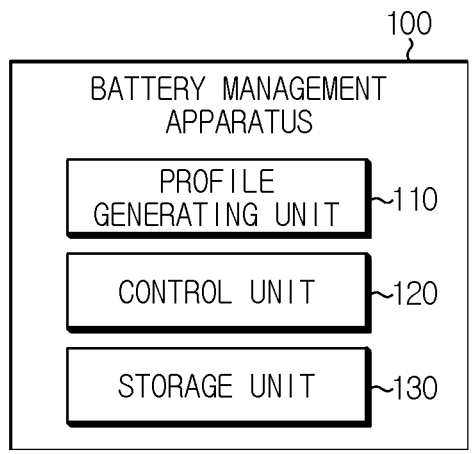
FIG. 1 is a diagram schematically showing a battery management apparatus according to an embodiment of the present disclosure.

FIG. 1 is a diagram schematically showing a battery management apparatus 100 according to an embodiment of the present disclosure.

The battery management apparatus 100 according to an embodiment of the present disclosure may manage a battery cell charged multiple times at each of a plurality of C-rates (Current rates).

Here, the battery cell means one physically separable independent cell including a negative electrode terminal and a positive electrode terminal. For example, one pouch-type lithium polymer cell may be regarded as a battery cell.

For example, the battery cell may be charged at a first C-rate C1, a second C-rate C2, a third C-rate C3, a fourth C-rate C4, and a fifth C-rate C5, respectively. That is, the battery cell may be fully charged at five C-rates from SOC (State of Charge) 0% to 100%.

As a specific example, the first C-rate C1 may be 0.05 C, the second C-rate C2 may be 0.33 C, and the third C-rate C3 may be 0.5 C. The fourth C-rate C4 may be 0.7 C, and the fifth C-rate C5 may be 1 C.

Referring to FIG. 1, the battery management apparatus 100 according to an embodiment of the present disclosure may include a profile generating unit 110 and a control unit 120.

The profile generating unit 110 may be configured to obtain a plurality of battery profiles representing a corresponding relationship between voltage and capacity of the battery cell at each of the plurality of C-rates.

The battery profile may be a profile representing a corresponding relationship between voltage and capacity of the battery cell. For example, when voltage is set to X and capacity is set to Y, the battery profile may be expressed as an X-Y graph or an X-Y table.

For example, as in the previous embodiment, when the battery cell is charged with the first C-rate C1, the second C-rate C2, the third C-rate C3, the fourth C-rate C4 and the fifth C-rate C5, the profile generating unit 110 may obtain five battery profiles corresponding to each of the first C-rate C1, the second C-rate C2, the third C-rate C3, the fourth C-rate C4, and the fifth C-rate C5.

The profile generating unit 110 may be configured to generate a plurality of differential profiles representing a corresponding relationship between the voltage of the battery cell and a differential capacity for the voltage based on each of the plurality of obtained battery profiles.

The differential profile may be a profile representing a corresponding relationship between the voltage and the differential capacity of the battery cell. First, for each of the plurality of battery profiles, the profile generating unit 110 may calculate a differential capacity by differentiating the capacity based on the voltage. In addition, the profile generating unit 110 may generate a differential profile according to the corresponding relationship between the voltage and the differential capacity. That is, when the voltage is set to X and the differential capacity is set to Y, the differential profile may be expressed as an X-Y graph or an X-Y table.

Figure 2:
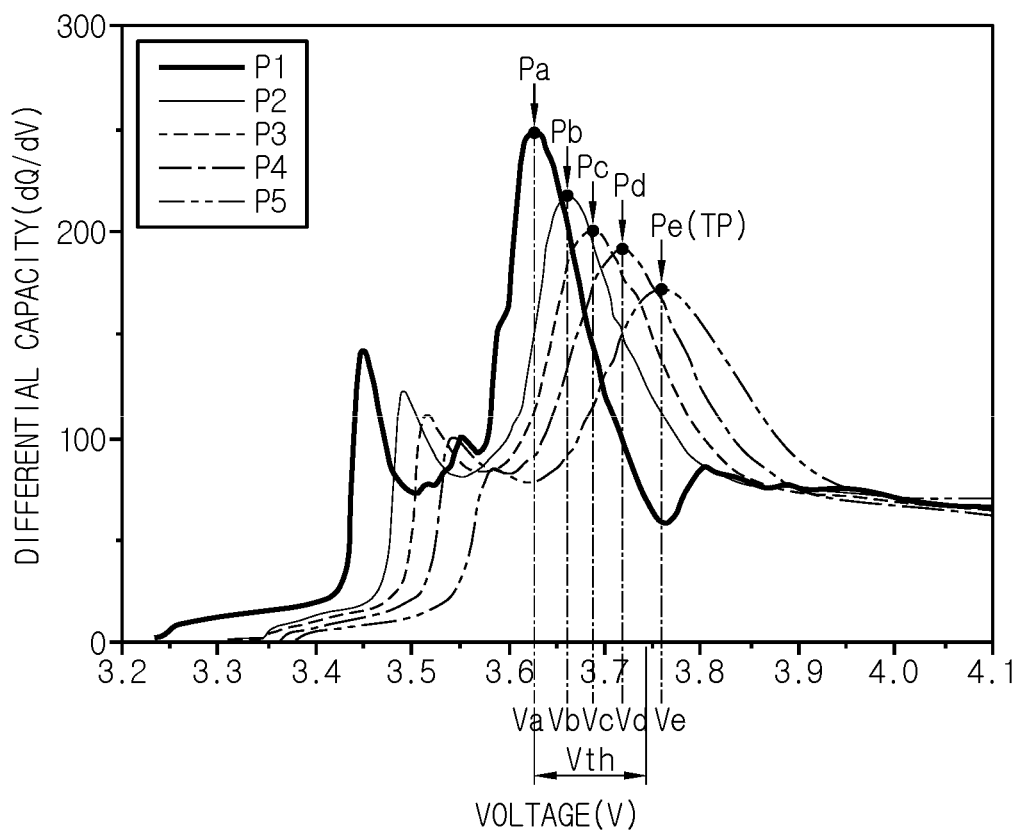
FIG. 2 is a diagram schematically showing a plurality of differential profiles generated by the battery management apparatus according to an embodiment of the present disclosure.

FIG. 2 is a diagram schematically showing a plurality of differential profiles generated by the battery management apparatus 100 according to an embodiment of the present disclosure.

For example, referring to FIG. 2, the profile generating unit 110 may generate five differential profiles P1, P2, P3, P4, P5 based on the five battery profiles. The first differential profile P1 is a differential profile corresponding to the battery cell charged with the first C-rate C1. The second differential profile P2 is a differential profile corresponding to the battery cell charged with the second C-rate C2. The third differential profile P3 is a differential profile corresponding to the battery cell charged with the third C-rate C3. The fourth differential profile P4 is a differential profile corresponding to the battery cell charged with the fourth C-rate C4. The fifth differential profile P5 is a differential profile corresponding to the battery cell charged with the fifth C-rate C5.

The control unit 120 may be configured to obtain the plurality of differential profiles P1, P2, P3, P4, P5 from the profile generating unit 110.

For example, the control unit 120 may be connected to communicate with the profile generating unit 110. The profile generating unit 110 may send the plurality of generated differential profiles P1, P2, P3, P4, P5 to the control unit 120, and the control unit 120 may obtain the plurality of differential profiles P1, P2, P3, P4, P5 by receiving the plurality of differential profiles P1, P2, P3, P4, P5 from the profile generating unit 110.

The control unit 120 may be configured to classify the plurality of differential profiles P1, P2, P3, P4, P5 into a criterion differential profile corresponding to a preset criterion C-rate and a plurality of reference differential profiles.

For example, the criterion C-rate may be preset to be less than 0.1 C. In this case, the control unit 120 may set a differential profile corresponding to the C-rate less than 0.1 C among the plurality of differential profiles P1, P2, P3, P4, P5 as the criterion differential profile, and set the remaining differential profiles as the reference differential profiles.

If a plurality of differential profiles correspond to the criterion C-rate, the control unit 120 may set a differential profile having the smallest corresponding C-rate as the criterion differential profile, and set the remaining differential profiles as the reference differential profiles.

Preferably, the criterion C-rate may be preset to be 0.05 C. In this case, the control unit 120 may set a differential profile corresponding to 0.05 C among the plurality of differential profiles as the criterion differential profile, and set the remaining differential profiles as the reference differential profiles.

Meanwhile, if there is no differential profile corresponding to the criterion C-rate among the plurality of differential profiles P1, P2, P3, P4, P5, the control unit 120 may set a differential profile with the smallest C-rate among the plurality of differential profiles as the criterion differential profile, and set the remaining differential profiles as the reference differential profiles.

For example, it is assumed that the criterion C-rate is preset to 0.05 C, the first C-rate C1, the second C-rate C2, the third C-rate C3, the fourth C-rate C4 and the fifth C-rate C5 are 0.05 C, 0.33 C, 0.5 C, 0.7 C, 1 C, respectively. In the embodiment of FIG. 2, the control unit 120 may set the first differential profile P1 corresponding to the first C-rate C1 as the criterion differential profile, and set the second to fifth differential profile P2, P3, P4, P5 corresponding to the second to fifth C-rates C2, C3, C4, C5 as the reference differential profiles. That is, among the first to fifth differential profiles P1, P2, P3, P4, P5, the first differential profile P1 may be classified into the criterion differential profile, and the second to fifth differential profiles P2, P3, P4, P5 may be classified into the reference differential profiles.

The control unit 120 may be configured to determine a criterion peak in the criterion differential profile and to determine a reference peak in each of the plurality of reference differential profiles.

The criterion peak and the reference peak may be peaks corresponding to each other. That is, the criterion peak and the reference peak may be points having an upward convex form in a predetermined voltage range in a differential profile corresponding thereto. Here, the point with an upward convex form means a point at which the instantaneous change rate of the differential capacity to voltage is 0, and based on the point, the instantaneous change rate at a low potential side is positive and the instantaneous change rate at a high potential side is negative.

For example, the criterion peak and the reference peak may be a point having the largest differential capacity among peaks included in 3.6V to 3.8V in the corresponding differential profile.

In the embodiment of FIG. 2, the first differential profile P1 may include a first peak Pa, the second differential profile P2 may include a second peak Pb, and the third differential profile P3 may include a third peak Pc. The fourth differential profile P4 may include a fourth peak Pd, and the fifth differential profile P5 may include a fifth peak Pe. That is, the control unit 120 may determine a criterion peak in the criterion differential profile, and determine a reference peak in each of the plurality of reference differential profiles.

The control unit 120 may be configured to compare the voltage of the determined criterion peak with the voltage of the plurality of determined reference peaks.

Specifically, the control unit 120 may compare the voltage of the criterion peak and the voltage of the plurality of determined reference peaks, respectively. That is, the control unit 120 may calculate a voltage difference between the criterion peak and each of the plurality of reference peaks.

For example, in the embodiment of FIG. 2, the voltage of the first peak Pa, which is the criterion peak, may be Va. The voltages of the second peak Pb, the third peak Pc, the fourth peak Pd, and the fifth peak Pe corresponding to the plurality of reference peaks may be Vb, Vc, Vd, and Ve, respectively. The control unit 120 may calculate a first voltage difference between the voltage Va of the first peak Pa and the voltage Vb of the second peak Pb, and calculate a second voltage difference between the voltage Va of the first peak Pa and the voltage Vc of the third peak Pc. The control unit 120 may calculate a third voltage difference between the voltage Va of the first peak Pa and the voltage Vd of the fourth peak Pd, and calculate a fourth voltage difference between the voltage Va of the first peak Pa and the voltage Ve of the fifth peak Pe.

The control unit 120 may be configured to determine an upper limit C-rate for the battery cell according to the comparison result. Specifically, the control unit 120 may be configured to compare the plurality of calculated voltage differences with a preset threshold voltage Vth, and determine the upper limit C-rate according to the comparison result.

For example, in the previous embodiment, the control unit 120 may compare each of the calculated first to fourth voltage difference with the preset threshold voltage Vth. Preferably, the control unit 120 may compare each of the first to fourth voltage differences with the threshold voltage Vth, and determine the upper limit C-rate for the battery cell according to the comparison result.

Here, the upper limit C-rate is set for each battery cell, and may mean a maximum C-rate allowable when the battery cell is charged and discharged. That is, the upper limit C-rate determined by the control unit 120 may be set as the maximum C-rate allowable for the battery cell. In addition, the battery cell may be charged or discharged at a C-rate less than the determined upper limit C-rate.

For example, when the battery cell is charged over the determined upper limit C-rate, a side reaction may occur in the battery cell. Specifically, lithium plating in which lithium is deposited on the negative electrode of the battery cell may occur. Accordingly, the control unit 120 may prevent a side reaction from occurring in the battery cell according to charging and discharging by determining the upper limit C-rate for the battery cell according to the result of comparing the voltage of the criterion peak and the voltage of the plurality of determined reference peaks.

That is, since the charging and discharging of the battery cell may be controlled according to the upper limit C-rate determined by the battery management apparatus 100 according to an embodiment of the present disclosure, the battery cell may be degraded slowly to increase the lifespan of the battery cell.

Meanwhile, the control unit 120 provided in the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program modules. At this time, the program module may be stored in a memory and executed by the control unit 120. The memory may be located inside or out of the control unit 120 and may be connected to the control unit 120 by various well-known means.

In addition, the battery management apparatus 100 may further include a storage unit 130. The storage unit 130 may store data necessary for operation and function of each component of the battery management apparatus 100, data generated in the process of performing the operation or function, or the like. The storage unit 130 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 130 may store program codes in which processes executable by the control unit 120 are defined.

For example, the plurality of battery profiles may be stored in the storage unit 130. In addition, the profile generating unit 110 may access the storage unit 130 to obtain the plurality of battery profiles. In addition, the plurality of differential profiles generated by the profile generating unit 110 may be stored in the storage unit 130. The control unit 120 may not only receive the plurality of differential profiles directly from the profile generating unit 110, but may also access the storage unit 130 to obtain the plurality of battery profiles and the plurality of differential profiles.

Hereinafter, an embodiment in which the control unit 120 determines the upper limit C-rate will be described.

For example, the control unit 120 may determine any one of the plurality of C-rates in which the battery cell is charged as the upper limit C-rate.

The control unit 120 may be configured to determine a reference peak of which the calculated voltage difference is equal to or greater than the threshold voltage Vth as a target peak TP.

For example, in the embodiment of FIG. 2, the threshold voltage Vth may be set in advance. In addition, a reference peak whose voltage difference is equal to or greater than the threshold voltage Vth based on the voltage of the criterion peak may be the fifth peak Pe. That is, the voltage difference between the voltage of the fifth peak Pe and the voltage of the criterion peak may be greater than the threshold voltage Vth. Accordingly, the control unit 120 may determine the fifth peak Pe as the target peak TP.

If there are a plurality of reference peaks of which the calculated voltage difference is equal to or greater than the threshold voltage Vth, the control unit 120 may determine a reference peak of which the calculated voltage difference is equal to or greater than the threshold voltage Vth and the calculated voltage difference is smallest as the target peak TP. That is, the control unit 120 may determine a reference peak of which the calculated voltage difference is equal to or greater than the threshold voltage Vth and the corresponding voltage is smallest as the target peak TP.

The control unit 120 may be configured to determine a C-rate corresponding to the reference differential profile including the determined target peak TP as the upper limit C-rate.

For example, in the embodiment of FIG. 2, when the fifth peak Pe is determined as the target peak TP, the control unit 120 may select the fifth differential profile P5 including the target peak TP. In addition, the control unit 120 may determine the fifth C-rate C5 corresponding to the fifth differential profile P5 as the upper limit C-rate.

As another example, the control unit 120 may determine the target C-rate TC based on the plurality of C-rates in which the battery cell is charged, and determine the determined target C-rate TC as the upper limit C-rate.

Specifically, the control unit 120 may be configured to generate a voltage profile Pv representing a corresponding relationship between the plurality of voltage differences and the plurality of C-rates.

For example, the control unit 120 may generate a voltage profile Pv for the C-rate and the voltage difference of the first differential profile P1, the second differential profile P2, the third differential profile P3, the fourth differential profile P4, and the fifth differential profile P5.

Figure 3:
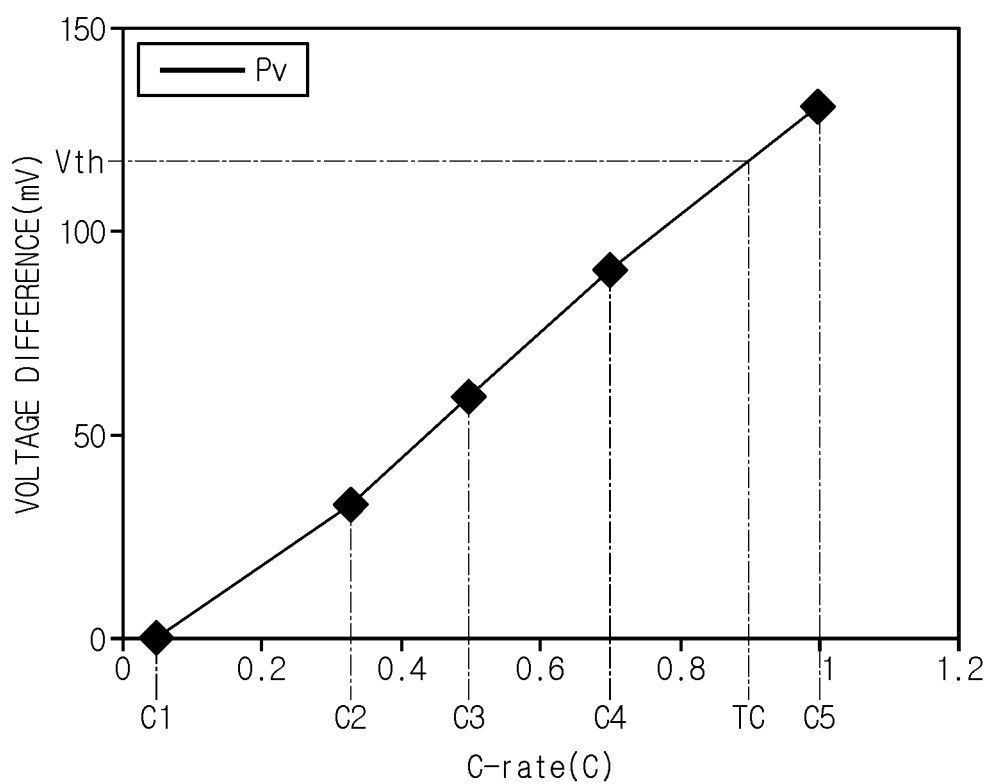
FIG. 3 is a diagram schematically showing a voltage profile generated by the battery management apparatus according to an embodiment of the present disclosure.

FIG. 3 is a diagram schematically showing the voltage profile Pv generated by the battery management apparatus 100 according to an embodiment of the present disclosure.

Referring to FIG. 3, the control unit 120 may generate a voltage profile Pv representing the first C-rate C1, the second C-rate C2 and the first voltage difference, the third C-rate C3 and the second voltage difference, the fourth C-rate C4 and the third voltage difference, and the fifth C-rate C5 and the fourth voltage difference. Here, the first C-rate C1 is a C-rate corresponding to the criterion differential profile. That is, since the voltage difference is calculated based on the voltage of the criterion peak, the voltage difference corresponding to the first C-rate C1 may be set to 0.

Also, referring to FIG. 2, the first voltage difference may be Vb-Va, and the second voltage difference may be Vc-Va. In addition, the third voltage difference may be Vd-Va, and the fourth voltage difference may be Ve-Va.

The control unit 120 may be configured to determine a target C-rate TC corresponding to the threshold voltage Vth in the generated voltage profile Pv as the upper limit C-rate.

Specifically, the control unit 120 may select a target C-rate TC corresponding to the threshold voltage Vth by putting the threshold voltage Vth into the generated voltage profile Pv. In addition, the control unit 120 may determine the selected target C-rate TC as the upper limit C-rate.

For example, in the embodiment of FIG. 3, the target C-rate corresponding to the threshold voltage Vth may be TC within 0.8 C to 1 C. The control unit 120 may determine the target C-rate TC as the upper limit C-rate for the battery cell.

Hereinafter, the content in which the threshold voltage Vth is set by the control unit 120 will be described.

The control unit 120 may be configured to obtain the plurality of battery profiles.

For example, the control unit 120 may access the storage unit 130 to obtain the plurality of battery profiles.

Figure 4:
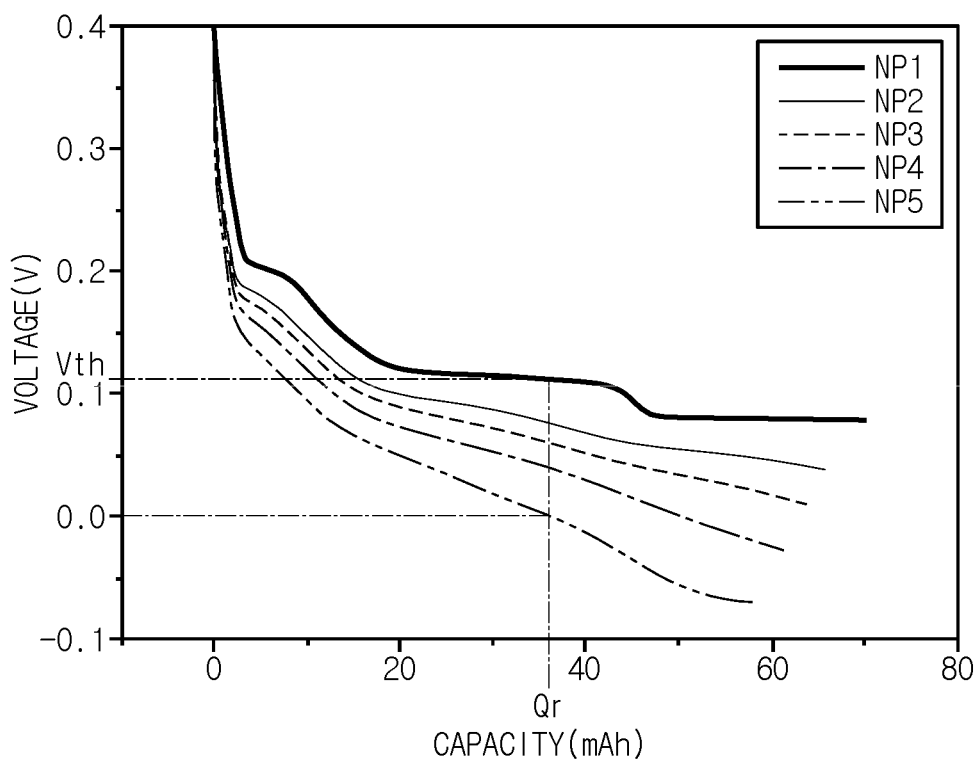
FIG. 4 is a diagram schematically showing a plurality of battery profiles according to an embodiment of the present disclosure.

FIG. 4 is a diagram schematically showing a plurality of battery profiles according to an embodiment of the present disclosure.

Specifically, FIG. 4 may be a negative electrode profile representing a corresponding relationship between voltage and capacity of a negative electrode of a battery cell charged multiple times at each of a plurality of C-rates.

Preferably, the battery profile includes a positive electrode profile representing a corresponding relationship between voltage and capacity of the positive electrode of the battery cell, a negative electrode profile representing a corresponding relationship between voltage and capacity of the negative electrode of the battery cell, and a full cell profile representing a corresponding relationship between voltage and capacity of the battery cell (full cell). For example, the profile generating unit 110 may generate a differential profile based on the full cell profile. In addition, the control unit 120 may obtain the negative electrode profile among the battery profiles from the storage unit 130.

For example, in the embodiment of FIG. 4, the control unit 120 may obtain a first negative electrode profile NP1 corresponding to the first C-rate C1, a second negative electrode profile NP2 corresponding to the second C-rate C2, and a third negative electrode profile NP3 corresponding to the third C-rate C3. Also, the control unit 120 may obtain a fourth negative electrode profile NP4 corresponding to the fourth C-rate C4 and a fifth negative electrode profile NP5 corresponding to the fifth C-rate C5.

The control unit 120 may be configured to determine a criterion battery profile corresponding to the criterion C-rate and a reference battery profile corresponding to the reference C-rate in the plurality of obtained battery profiles.

Specifically, the control unit 120 may be configured to determine the criterion battery profile and the reference battery profile in the plurality of obtained negative electrode profiles.

For example, the reference C-rate may be preset to be 1 C or higher. In this case, the control unit 120 may set a battery profile corresponding to a C-rate of 1 C or more among the plurality of battery profiles as the reference battery profile. If a plurality of battery profiles correspond to the reference C-rate, the control unit 120 may set a battery profile having the largest corresponding C-rate as the criterion battery profile and set the remaining battery profiles as the reference battery profiles.

Preferably, the reference C-rate may be preset to be 1 C. In this case, the control unit 120 may set a battery profile corresponding to 1C among the plurality of battery profiles as the reference battery profile.

Meanwhile, when there is no battery profile corresponding to the reference C-rate among the plurality of battery profiles, the control unit 120 may set a battery profile having the largest C-rate among the plurality of battery profiles as the reference battery profile.

For example, in the embodiment of FIG. 4, it is assumed that the criterion C-rate is preset to be 0.05 C and the reference C-rate is preset to be 1 C. In addition, it is assumed that the first C-rate C1, the second C-rate C2, the third C-rate C3, the fourth C-rate C4, and the fifth C-rate C5 are 0.05 C, 0.33 C, 0.5 C, 0.7 C and 1 C, respectively. The control unit 120 may determine the first negative electrode profile NP1 corresponding to the first C-rate C1 as the criterion battery profile, and determine the fifth negative electrode profile NP5 corresponding to the fifth C-rate C5 as the reference battery profile.

The control unit 120 may be configured to set the threshold voltage Vth based on the determined criterion battery profile and the determined reference battery profile.

Specifically, the control unit 120 may select a reference capacity that satisfies a predetermined condition in the reference battery profile. In addition, the control unit 120 may be configured to set a voltage corresponding to the reference capacity in the criterion battery profile as the threshold voltage Vth.

For example, in the embodiment of FIG. 4, it is assumed that the reference capacity satisfying a predetermined condition is Qr. The control unit 120 may set a voltage corresponding to the reference capacity as the threshold voltage Vth in the criterion battery profile. That is, the voltage Vth corresponding to the reference capacity (Qr) in the first negative electrode profile NP1 may be set as the threshold voltage Vth.

Specifically, the control unit 120 may be configured to select a capacity corresponding to a point at which the negative electrode voltage is 0 in the reference battery profile as the reference capacity. That is, the reference capacity satisfying the predetermined condition may be a capacity corresponding to 0 [V] in the reference battery profile. In addition, the control unit 120 may be configured to set a negative electrode voltage corresponding to the reference capacity in the criterion battery profile as the threshold voltage Vth.

For example, in the embodiment of FIG. 4, the capacity corresponding to 0 [V] in the fifth negative electrode profile NP5 may be Qr. Accordingly, the control unit 120 may select Qr [mAh] as the reference capacity. In addition, the voltage corresponding to the reference capacity in the first negative electrode profile NP1 may be Vth. Accordingly, the control unit 120 may set Vth [V] as the threshold voltage Vth.

The battery management apparatus 100 according to the present disclosure may be applied to a BMS (Battery Management System). That is, the BMS according to the present disclosure may include the battery management apparatus 100 described above. In this configuration, at least some of the components of the battery management apparatus 100 may be implemented by supplementing or adding functions of the configuration included in the conventional BMS. For example, the profile generating unit 110, the control unit 120 and the storage unit 130 of the battery management apparatus 100 may be implemented as components of the BMS.

In addition, the battery management apparatus 100 according to the present disclosure may be provided in a battery pack 1. That is, the battery pack 1 according to the present disclosure may include the above-described battery management apparatus 100 and one or more battery cells. In addition, the battery pack 1 may further include electrical equipment (relays, fuses, etc.) and a case.

Figure 5:
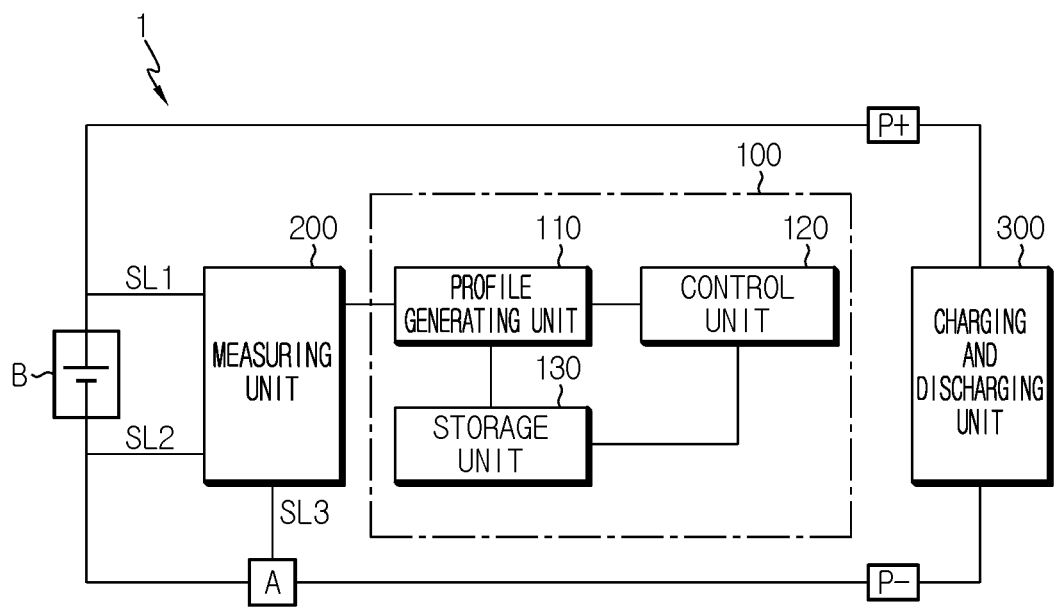
FIG. 5 is a diagram schematically showing an exemplary configuration of a battery pack according to another embodiment of the present disclosure.

FIG. 5 is a diagram schematically showing an exemplary configuration of a battery pack 1 according to another embodiment of the present disclosure.

Referring to FIG. 5, the battery pack 1 may include a battery management apparatus 100, a measuring unit, and a charging and discharging unit 300.

In the embodiment of FIG. 5, the measuring unit may be connected to a first sensing line SL1, a second sensing line SL2, and a third sensing line SL3. The measuring unit may measure the positive electrode voltage of the battery cell through the first sensing line SL1, and measure the negative electrode voltage of the battery cell through the second sensing line SL2. In addition, the measuring unit may measure the voltage of the battery cell by calculating a difference between the measured positive electrode voltage and the measured negative electrode voltage.

In addition, the measuring unit may be connected to a current measuring unit A through the third sensing line SL3. The current measuring unit A may be provided on the charging and discharging path of the battery cell. For example, the current measuring unit A may be a current meter or a shunt resistor.

In addition, the charging and discharging path may be a high current path through which the charging current and the discharging current of the battery cell flow. Accordingly, the measuring unit may measure the current of the battery cell B through the third sensing line SL3 connected to the current measuring unit A, and measure the capacity of the battery cell based on the measured current.

In addition, both ends of the charging and discharging unit 300 may be connected to a charging and discharging path of the battery cell. For example, one end of the charging and discharging unit 300 may be connected to the positive electrode of the battery cell on the charging and discharging path. In addition, the other end of the charging and discharging unit 300 may be connected to the negative electrode of the battery cell on the charging and discharging path. In addition, the charging and discharging unit 300 may charge and/or discharge the battery cell under the control of the control unit 120.

For example, in the embodiment of FIG. 5, the charging and discharging unit 300 may charge the battery cell multiple times at each of a plurality of C-rates. Specifically, the charging and discharging unit 300 may charge the battery cell from SOC (State of Charge) 0% to 100%. The measuring unit may measure voltage and capacity while the battery cell is being charged, and generate a battery profile representing a corresponding relationship between the voltage and the capacity of the battery cell. The measuring unit may send the plurality of generated battery profiles to the battery management apparatus 100, and the profile generating unit 110 may receive the plurality of battery profiles from the measuring unit.

FIG. 6 is a diagram schematically showing a battery management method according to still another embodiment of the present disclosure.

Preferably, the battery management method is a method of managing a battery cell charged multiple times at each of a plurality of C-rates, and each step of the battery management method may be performed by the battery management apparatus 100. Hereinafter, for convenience of description, contents overlapping with the previously described contents will be omitted or briefly described.

Referring to FIG. 6, the battery management method may include a plural battery profile obtaining step (S100), a differential profile generating step (S200), a differential profile classifying step (S300), a criterion peak and reference peak determining step (S400) and an upper limit C-rate determining step (S500).

The plural battery profile obtaining step (S100) is a step of obtaining a plurality of battery profiles representing a corresponding relationship between voltage and capacity of a battery cell at each of the plurality of C-rates, and may be performed by the profile generating unit 110.

Each battery profile may represent a corresponding relationship between voltage and capacity of a battery cell charged at a corresponding C-rate. The profile generating unit 110 may receive a plurality of battery profiles from the outside, or may access the storage unit 130 to obtain the plurality of battery profiles.

For example, the profile generating unit 110 may obtain first to fifth battery profiles, and each of the first to fifth battery profiles may correspond to each of the first to fifth C-rates C1, C2, C3, C4, C5.

The differential profile generating step (S200) is a step of generating a plurality of differential profiles representing a corresponding relationship between the voltage of the battery cell and a differential capacity for the voltage based on each of the plurality of obtained battery profiles, and may be performed by the profile generating unit 110.

For example, the profile generating unit 110 may generate a plurality of differential profiles based on each of the plurality of obtained battery profiles. That is, the profile generating unit 110 may generate one differential profile for one battery profile.

In the embodiment of FIG. 2, the profile generating unit 110 may generate a first differential profile P1 based on the first battery profile, and generate a second differential profile P2 based on the second battery profile. The profile generating unit 110 may generate a third differential profile P3 based on the third battery profile, generate a fourth differential profile P4 based on the fourth battery profile, and generate a fifth differential profile P5 based on the fifth battery profile.

The differential profile classifying step (S300) is a step of classifying the plurality of differential profiles into a criterion differential profile corresponding to a preset criterion C-rate and a plurality of reference differential profiles, and may be performed by the control unit 120.

For example, the criterion C-rate may be set to be 0.05 C, the first C-rate C1 may be 0.05 C, the second C-rate C2 may be 0.33 C, and the third C-rate C3 may be 0.5 C. It is assumed that the fourth C-rate C4 is 0.7 C and the fifth C-rate C5 is 1 C. In the embodiment of FIG. 2, the control unit 120 may classify the first differential profile P1 corresponding to the criterion C-rate as the criterion differential profile, and classify the second to fifth differential profiles P2, P3, P4, P5 as the reference differential profiles.

The criterion peak and reference peak determining step (S400) is a step of determining a criterion peak in the criterion differential profile and a reference peak in each of the plurality of reference differential profiles, and may be performed by the control unit 120.

For example, the control unit 120 may determine the first to fifth peaks Pa, Pb, Pc, Pd, Pe in each of the first to fifth differential profiles P1, P2, P3, P4, P5. In addition, the first peak Pa included in the first differential profile P1, which is the criterion differential profile, may be determined as the criterion peak. In addition, the second to fifth peaks Pb, Pc, Pd, Pe included in the second to fifth differential profiles P2, P3, P4, P5, which are the reference differential profiles, may be determined as the reference peaks.

The upper limit C-rate determining step (S500) is a step of comparing the voltage of the determined criterion peak with the voltage of the plurality of determined reference peaks, and determining the upper limit C-rate for the battery cell according to the comparison result, may be performed by the control unit 120.

For example, in the embodiment of FIG. 2, the control unit 120 may calculate a voltage difference by comparing the voltage of the criterion peak and the voltage of the plurality of reference peaks, respectively, compare the calculated voltage difference with the threshold voltage Vth, and determine the upper limit C-rate for the battery cell according to the comparison result.

The battery management method according to an embodiment of the present disclosure may control charging and discharging of the battery cell by determining the upper limit C-rate at which the degradation of the battery cell may be accelerated (that is, a side reaction may further occur in the battery cell), for a battery cell charged multiple times at each of a plurality of C-rates. Accordingly, since the battery cell may be charged and discharged at a C-rate less than the upper limit C-rate, the lifespan of the battery cell may be increased.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
100: battery management apparatus
110: profile generating unit
120: control unit
130: storage unit
200: measuring unit
300: charging and discharging unit

What is claimed is:

1. A battery management apparatus, which manages a battery cell charged multiple times at each of a plurality of current rates (C-rates), comprising:
a controller; and
memory having stored thereon instructions that, when executed, are configured to cause the controller to:
for each of a plurality of battery profiles representing a relationship between voltage and capacity of a battery cell at respective current rates (C-rates), obtain a differential profile representing a relationship between the voltage and a differential capacity of the battery cell;
classify the plurality of differential profiles into a threshold differential profile corresponding to a preset threshold C-rate and a plurality of reference differential profiles;
determine a threshold peak in the threshold differential profile;
determine a plurality of reference peaks including a respective reference peak in each of the plurality of reference differential profiles;
compare a voltage of the determined threshold peak with a voltage of the plurality of determined reference peaks; and
determine an upper limit C-rate for the battery cell based on the comparison, wherein the battery cell is configured to be charged and/or discharged at a C-rate equal to or less than the upper limit C-rate.

2. The battery management apparatus according to claim 1,
wherein the instructions are configured to cause the controller to:
for each respective reference peak of the plurality of reference peaks, calculate a respective voltage difference between the threshold peak and the reference peak;

compare the respective calculated voltage differences with a preset threshold voltage; and determine the upper limit C-rate based on the comparison.

3. The battery management apparatus according to claim 2, wherein the instructions are configured to cause the controller to:

determine a reference peak for which the corresponding calculated voltage difference is equal to or greater than the threshold voltage as a target peak; and determine a C-rate corresponding the reference differential profile including the determined target peak as the upper limit C-rate.

4. The battery management apparatus according to claim 2, wherein the instructions are configured to cause the controller to:

generate a voltage profile representing a relationship between the respective voltage differences and the plurality of C-rates; and determine an upper limit C-rate as the threshold voltage in the generated voltage profile.

5. The battery management apparatus according to claim 2, wherein the instructions are configured to cause the controller to:

obtain the plurality of battery profiles;

determine, from among the plurality of obtained battery profiles, a threshold battery profile corresponding to the threshold C-rate and a reference battery profile corresponding to a reference C-rate; and set the threshold voltage based on the determined threshold battery profile and the determined reference battery profile.

6. The battery management apparatus according to claim 5, wherein the instructions are configured to cause the controller to:

select a reference capacity satisfying a predetermined condition in the reference battery profile; and set a voltage corresponding to the reference capacity in the threshold battery profile as the threshold voltage.

7. The battery management apparatus according to claim 6, wherein the instructions are configured to cause the controller to select a capacity corresponding to a point in the reference battery profile at which a negative electrode voltage is 0 as the reference capacity.

8. The battery management apparatus according to claim 6, wherein the instructions are configured to cause the controller to set a negative electrode voltage corresponding to the reference capacity in the threshold battery profile as the threshold voltage.

9. A battery pack, comprising the battery management apparatus according to claim 1.

10. A battery management method, which manages a battery cell charged multiple times at each of a plurality of C-rates, comprising:

obtaining a plurality of battery profiles representing a corresponding relationship between voltage and capacity of the battery cell at each of the plurality of C-rates;

for each of a plurality of battery profiles representing a relationship between voltage and capacity of a battery cell at respective C-rate, obtaining, by a controller, a differential profile representing a relationship between the voltage and a differential capacity of the battery cell;

classifying, by the controller, the plurality of differential profiles into a threshold differential profile corresponding to a preset threshold C-rate and a plurality of reference differential profiles;

determining, by the controller, a threshold peak in the threshold differential profile;

determining, by the controller, a plurality of reference peaks including a respective reference peak in each of the plurality of reference differential profiles;

comparing, by the controller, a voltage of the determined threshold peak with a voltage of the plurality of determined reference peaks; and determining, by the controller, an upper limit C-rate for the battery cell based on the comparison, wherein the battery cell is configured to be charged and/or discharged at a C-rate equal to or less than the upper limit C-rate.

* * * * *